(12) United States Patent
Greer (10) Patent No.: US 12,217,968 B2
(45) Date of Patent: Feb. 4, 2025

(54) ATOMIC LAYER ETCHING FOR SMOOTHING OF ARBITRARY SURFACES

(71) Applicant: California Institute of Technology, Pasadena, CA (US)

(72) Inventor: Harold Frank Greer, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 17/224,037

(22) Filed: Apr. 6, 2021

(65) Prior Publication Data

US 2021/0313185 A1 Oct. 7, 2021

Related U.S. Application Data

(60) Provisional application No. 63/005,709, filed on Apr. 6, 2020.

(51) Int. Cl.
| | |
|---|---|
| *H01L 21/306* | (2006.01) |
| *H01L 21/3105* | (2006.01) |
| *H01L 21/321* | (2006.01) |
| *H01L 21/67* | (2006.01) |
| *H01L 21/677* | (2006.01) |

(52) U.S. Cl.
CPC .. *H01L 21/30604* (2013.01); *H01L 21/31055* (2013.01); *H01L 21/32115* (2013.01); *H01L 21/67075* (2013.01); *H01L 21/67703* (2013.01); *H01L 21/67739* (2013.01)

(58) Field of Classification Search
CPC ......... H01L 21/30604; H01L 21/31055; H01L 21/67075; H01L 21/67703; H01L 21/67739
See application file for complete search history.

(56) References Cited

U.S. PATENT DOCUMENTS

| | | | | |
|---|---|---|---|---|
| 2001/0004066 | A1* | 6/2001 | Toshima | H01L 21/02063 257/E21.255 |
| 2011/0139748 | A1* | 6/2011 | Donnelly | H01J 37/32045 216/37 |
| 2017/0243755 | A1* | 8/2017 | Tapily | H01L 21/67161 |
| 2018/0223437 | A1* | 8/2018 | George | C23F 4/00 |
| 2019/0131130 | A1* | 5/2019 | Smith | C23C 16/40 |
| 2020/0027740 | A1* | 1/2020 | Vervuurt | H01L 21/0337 |
| 2020/0027746 | A1* | 1/2020 | Vervuurt | H01J 37/32862 |
| 2020/0161148 | A1* | 5/2020 | Abel | C23F 1/12 |
| 2020/0194278 | A1* | 6/2020 | Zandi | C09K 13/00 |
| 2022/0136104 | A1* | 5/2022 | Pasquale | H01L 21/67754 427/446 |

OTHER PUBLICATIONS

Google dictionary definition for "conveyor" via https://www.google.com/search?q=conveyor+definition&rlz=1C1GCEA_enUS794US794&oq=conve&aqs=chrome.0.69i59l2j46l199i29l1433i512j69i57j0i512j69i61j69i60l2.1048j0j1&sourceid=chrome&ie=UTF-8 ; p. 1; (Year: 2022).*

* cited by examiner

*Primary Examiner* — Binh X Tran
(74) *Attorney, Agent, or Firm* — Gates & Cooper LLP (57) ABSTRACT

A method for etching a surface including obtaining a substrate comprising a material; reacting a surface of a substrate with a reactant, comprising a gas or a plasma, to form a reactive layer on the substrate, the reactive layer comprising a chemical compound including the reactant and the material; and wet etching or dissolving the reactive layer with a liquid wet etchant of solvent that selectively etches or dissolves the reactive layer but not the substrate.

28 Claims, 10 Drawing Sheets

ATOMIC LAYER ETCHING FOR SMOOTHING OF ARBITRARY SURFACES

CROSS REFERENCE TO RELATED APPLICATIONS

This application claims the benefit under 35 USC 119(e) of co-pending and commonly assigned U.S. Provisional Patent Application Ser. No. 63/005,709, filed Apr. 6, 2020, by Harold Frank Greer, entitled "ATOMIC LAYER ETCHING FOR SMOOTHING OF ARBITRARY SURFACES," (CIT-8456-P), which application is incorporated by reference herein.

STATEMENT REGARDING FEDERALLY SPONSORED RESEARCH AND DEVELOPMENT

This invention was made with government support under Grant No. 80NMO0018D0004 awarded by NASA (JPL). The government has certain rights in the invention.

BACKGROUND OF THE INVENTION

1. Field of the Invention

The present invention relates to methods and systems for etching and smoothing or reducing the roughness of materials.

2. Description of the Related Art

Devices and elements in semiconductor, display, and optical systems are continuously shrinking in size and increasing in complexity. The assembly of these devices into their final form is also particularly complicated. For either or both of these reasons, the smoothness of the interfaces and surfaces of these components are particularly important. Thus, there is a need to control and minimize the roughness of materials within devices and elements in semiconductor, display, and optical devices for optical, mechanical, and assembly reasons. The present disclosure satisfies this need.

SUMMARY OF THE INVENTION

Illustrative, non-exclusive examples of inventive subject matter according to the present disclosure are described in the following enumerated paragraphs.
1. A method for etching a surface, comprising:
   (a) obtaining a substrate comprising a material;
   (b) optionally pre-cleaning a surface of the substrate (e.g., using argon ion bombardment, oxygen cleaning, or hydrogen reduction);
   (c) reacting a surface (e.g., the pre-cleaned surface) of the substrate with a reactant, comprising a gas or a plasma, to form a reactive layer on the substrate, the reactive layer comprising a chemical compound including the reactant and the material; the reactive layer may be chosen in such a way that the volatility of the material is low or completely involatile;
   (d) optionally performing an activation step (activating the reactive layer e.g., using argon ion bombardment) where the activation may cause the reactive layer to form a more soluble film or one that is more selectively etched than the original reactive layer; the activation step may change the stoichiometry and/or oxidation state of the reactive layer; and
   (e) wet etching the reactive layer (e.g., the activated reactive layer) with a liquid wet etchant that selectively etches the reactive layer but not the substrate. The wet etchant can also dissolve the reactive layer rather than chemically react with it.
2. The method of paragraph 1, wherein the reactive layer comprises protrusions having sidewalls and the wet etching etches the protrusions or valleys laterally through the sidewalls so as to smooth and/or planarize the surface and remove or shrink the protrusions or valleys.
3. The method of paragraph 2, wherein the protrusions have a height and width in a range of 1-100 nm and/or the valleys have a depth and width of 1-100 nm.
4. The method of any of the paragraphs 1-3, wherein the reactant comprises at least one of a halogen that halogenates the surface, a sulphide so as to form the reactive layer comprising a sulphide, hydrogen or a hydride so as to form the reactive layer comprising a hydride, a nitride or nitrogen so as to form the reactive layer comprising a nitride, or oxygen or an oxide so as to form the reactive layer comprising an oxide.
5. The method of any of the paragraphs 1-3, wherein the reactant forms the reactive layer comprising a salt.
6. The method of any of the paragraphs 1-3, wherein the reactant comprises an oxidizer that oxidizes the surface to form the reactive layer comprising an oxide.
7. The method of any of the paragraphs 1-6, wherein the material comprises a semiconductor, a metal, or a dielectric.
8. The method of any of the paragraphs 1-6, wherein the material comprises silicon dioxide, copper, cobalt, tungsten, tin, silicon, a III-V material, or a II-VI material.
9. The method of any of the paragraphs 1-8, wherein the reacting comprises projecting the reactant onto the surface with an energy below that required for physical sputtering of the surface using the reactant, so that the material is not ejected from the substrate.
10. The method of paragraph 9, further comprising performing the reacting for a duration and projecting the reactant at the surface with an energy and/or thermal reactivity so as to form the reactive layer having a thickness of 30 nm or less.
11. The method of any of the paragraphs 1-10, further comprising repeating steps (c) and (e) or (b)-(e) so as to perform a plurality of etching cycles each comprising the step (c) and the step (e), wherein:
   the cycles include a first cycle and a second cycle subsequent to the first cycle,
   the second cycle forms the reactive layer that is thinner as compared to the reactive layer formed in the first cycle, so that the wet etching in the second cycle etches the reactive layer with a finer resolution as compared to the wet etching in the first cycle.
12. The method of paragraph 11, wherein the plurality of etching cycles form the substrate having an atomic scale surface roughness (e.g., a surface roughness less than 1 nm).
13. The method of any of the paragraphs 1-12, wherein the reacting is under conditions such that the reactive layer is involatile.
14. The method of any of the paragraphs 1-13, wherein the reacting is at a pressure of 10 Torr or less and the wet etching is at or near atmospheric pressure (e.g., at a pressure P in a range 500 Torr≤P≤1000 Torr).

15. The method of any of the paragraphs 1-14, wherein the wet etching dissolves or etches the entire reactive layer and the method further comprises performing a thermal treatment of the wet etched substrate and or the reactive layer.
16. An apparatus for etching a substrate, comprising:
   one or more reactor tools configured to react a reactant with a surface of a substrate so as to form a reactive layer on the substrate, wherein the reactant comprises a gas or a plasma, the substrate comprises a material, and the reactive layer comprises a chemical compound including the reactant and the material; and
   one or more etching tools selectively etching the reactive layer using a wet etchant.
17. The apparatus of example 16, further comprising a conveyor or conveyor belt conveying the substrate between the reactor tools and the etching tools, wherein the etching tools and the reactor tools operate at or near atmospheric pressure.
18. The apparatus of example 16, further comprising:
   a load lock chamber for loading the substrate into the apparatus;
   a transfer chamber for transferring the substrate between the load lock, the reactor tools, and the etching tools; and
   one or more arms positioned to transfer the substrate between the load lock, the reactor tools (e.g., comprising dry process chambers), and the etching tools (e.g., comprising wet process chambers).
19. The apparatus of any of the examples 16 or 18, further comprising one or more computers or controllers:
   (a) instructing the one or more arms to move the substrate to one of the reactor tools and controlling the one or more reactors reacting the reactant with the surface so as to form the reactive layer; and'
   (b) instructing the one or more arms to move the substrate to one of the etching tools and controlling the one of the etching tools so as to control contact of the wet etchant on the reactive layer so as to controllably wet etch the reactive layer.
20. The apparatus of example 19, wherein the computer: instructs a repeat of steps (a) and (b) so as to perform a plurality of etching cycles each comprising the step (a) and the step (b), wherein:
   the cycles include a first cycle and a second cycle subsequent to the first cycle,
   the second cycle forms the reactive layer that is thinner as compared to the reactive layer formed in the first cycle, so that the wet etching in the second cycle etches the reactive layer with a finer resolution as compared to the wet etching in the first cycle.
21. The apparatus of any of the examples 16, 18, 19, or 20, wherein at least one of the reactor tools comprises a vacuum chamber.
22. The apparatus of any of the paragraphs 16-21 configured to perform the method of any of the paragraphs 1-15.
23. A substrate treated (etched or planarized) using the method of any of the paragraphs 1-15 or the apparatus of any of the paragraphs 16-22.

BRIEF DESCRIPTION OF THE DRAWINGS

Referring now to the drawings in which like reference numbers represent corresponding parts throughout:

FIGS. 3A and 3B illustrate atomic force microscope (AFM) images a copper surface prior to etching, wherein FIG. 3A is a top view of a 2 micrometer ($\mu$m) by 2 micrometer area and FIG. 3B is a three dimensional (3D) view of the copper surface shown in FIG. 3A wherein the height is in nanometers (nm).

FIGS. 3C-3F illustrate AFM images of the copper surface after the etching according to the method illustrated in FIG. 1 (e.g., after wet etching of the reactive layer), wherein the reactive layer comprises a chloride and the wet etching comprises an acid bath. FIG. 3C is a top view of a 2 micron by 2 micron area of copper surface including a post processing scratch formed after the etching (i.e., the scratch is not related to the etching process described herein) and FIG. 3D is a 3D view of the area shown in FIG. 3C. FIG. 3E is a top view of another 2 micron by 2 micron area of a smoothened copper surface and FIG. 3F is the 3D view of the copper surface shown in FIG. 3E, wherein the height is in nanometers (nm).

DETAILED DESCRIPTION OF THE INVENTION

Figure 1:
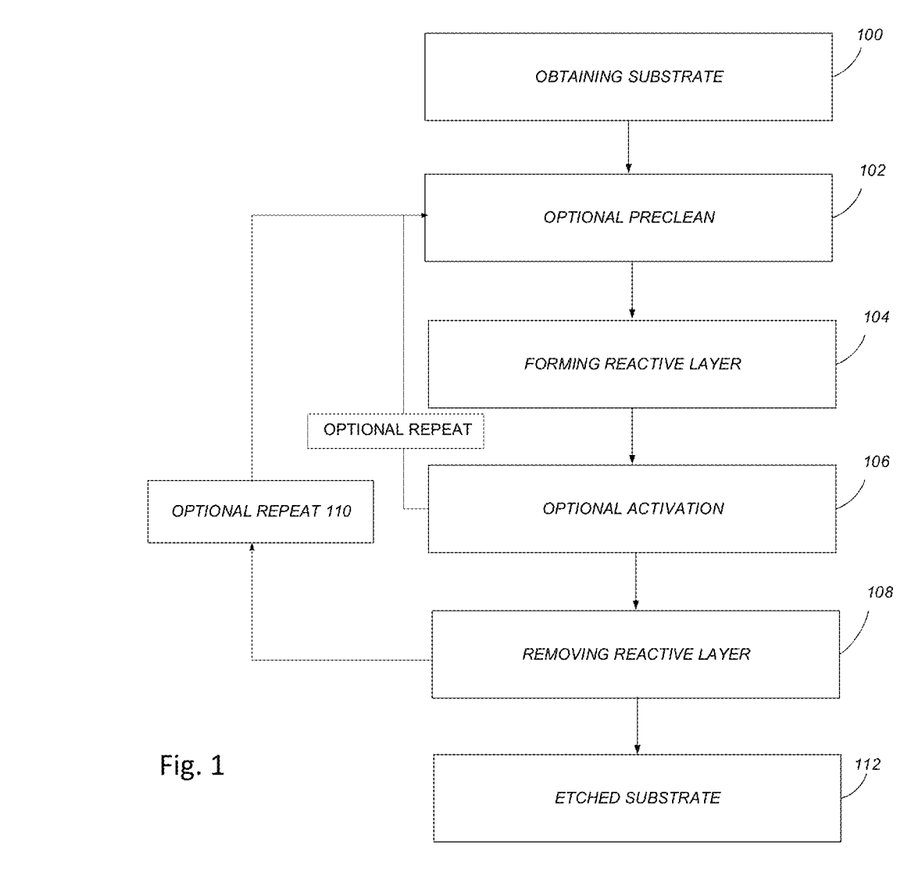
FIG. 1 illustrates a method of etching according to one or more examples described herein.

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.
Technical Description
Example Method FIG. 1 illustrates a method for etching (e.g., atomic layer etching ALE) a surface according to one or more examples. The method comprises the following steps.

Block 100 represents obtaining a substrate comprising a material. Example materials include, but are not limited to, a semiconductor (e.g., silicon, a III-V material, or a II-VI material), a metal (e.g., copper, tin, cobalt), or a dielectric (e.g., silicon dioxide).

Block 102 represents optionally pre-cleaning a surface of the substrate (e.g., using argon ion bombardment, oxygen cleaning, thermal treatment, UV treatment, or hydrogen reduction).

Block 104 represents reacting a surface (e.g., the pre-cleaned surface) of a substrate with a reactant, comprising a gas or a plasma, to form a reactive layer or skin on the substrate, the reactive layer or skin comprising a chemical compound including the reactant and the material. In one example, the reactant comprises a halogen (e.g., chlorine, fluorine, bromine) that halogenates the surface. In other examples, the reactant comprises a sulphide so as to form the reactive layer comprising a sulphide, or hydrogen or a hydride so as to form the reactive layer comprising a hydride or reduced surface, or nitrogen or a nitride so as to form the reactive layer comprising a nitride. In another example, the reactant comprises an oxidizer that oxidizes the surface to form the reactive layer comprising an oxide. Example oxidation processes include, but are not limited to, subjecting the substrate to a high temperature in oxygen (although some metals may flow and agglomerate), subjecting the substrate to UV ozone exposure at room temperature, subjecting the substrate to oxygen radicals from a downstream plasma, or oxidation with a direct plasma with $O_2$ gas-based mixtures.

In yet a further example, the reactant forms the reactive layer comprising a salt and/or composition (e.g., CuCl, CuOCl, CuOCl2, CuCl2, CuF in the case of etching copper) that prefers bonding to itself rather than the substrate.

Block 106 represents optionally performing an activation step (activating the reactive layer e.g., using argon ion bombardment). Note that it is possible to return to Block 102 and complete several cycles through blocks 102-106 prior to moving on to Block 108 (the etching or removal of the reactive layer).

Block 108 represents etching the reactive layer (e.g., the activated reactive layer), e.g., using a self-limiting or atomic layer etch. In one example, etching represents one or more exposures of the reactive layer to a fluid or a liquid. That liquid or series of liquids can etch away or dissolve the reactive layer, leaving the underlying substrate material. In one example, etching comprises dry etching the wet etched surface, e.g., using ions in a plasma. In one or more examples, the ion energy, ion angular distribution, and chemistry can be precisely controlled in a cyclic fashion. For example, minimizing the ion energy, increasing the ion angular distribution (through low bias, high pressure, and chemistry), one can ensure that the lateral etch rate of features is maximized. In one or more examples, the ions are accelerated using a relatively low bias voltage and such that the ion transit time through the plasma sheath to the substrate is relatively long, resulting in a broader ion angular distribution impacting the wafer (nearly 10 degrees off normal, as compared to 1-2 degrees for high bias conventional etching). Under such conditions, the protrusions are etched from all sides due to a substantially greater lateral etch rate. Ultimately, the protrusions can be eliminated or nearly eliminated, leaving a flat surface upon which to do subsequent processes, or to achieve a smoother substrate for an additional purpose.

An atomic layer or self-limiting etch is not unique to plasma-based processes. Any process where a self-limiting reaction layer can be formed and then later removed in an etching step can be utilized to reduce the roughness of materials. In one or more further examples, wet or thermal processes can be used to create and remove the reactive layer, and various processing techniques can be combined to achieve a desired result. Thus, in one or more examples, the step comprises etching the reactive layer with a (e.g., liquid) wet etchant that selectively etches the reactive layer but not the substrate (or selectively etches the reactive layer much more effectively or at a much larger etching rate as compared to the substrate). In various examples, the reaction layer is transformed into a liquid/fluid phase by the etchant. In various examples, the wet etching comprises an isotropic wet etch.

In yet another example, the reactive layer is etched or removed using a thermal process.

In one or more examples, the etching or removal in step 108 includes a combination of any two processes selected from a dry etch, a wet etch, and a thermal process (which can optionally be combined into one ALE sequence).

Block 110 represents optionally repeating at least steps 104 and 108 (or the sequence of steps 102-108) so as to perform a plurality of etching cycles. In one or more examples, the etching cycles include a first cycle and a second cycle subsequent to the first cycle, wherein the second cycle optionally forms the reactive layer that is thinner as compared to the reactive layer formed in the first cycle, so that the wet etching in the second cycle (or dry etching in second cycle) etches the reactive layer with a finer resolution as compared to the wet etching in the first cycle. Further cycles can also be tailored to form thinner and thinner reaction layers.

Block 112 represents the end result, an etched substrate, e.g., as illustrated in FIG. 3C-3F.

Illustrative, non-exclusive examples of inventive subject matter according to the present disclosure are described in the following enumerated examples (referring also to FIGS. 1-5).

Figure 4:
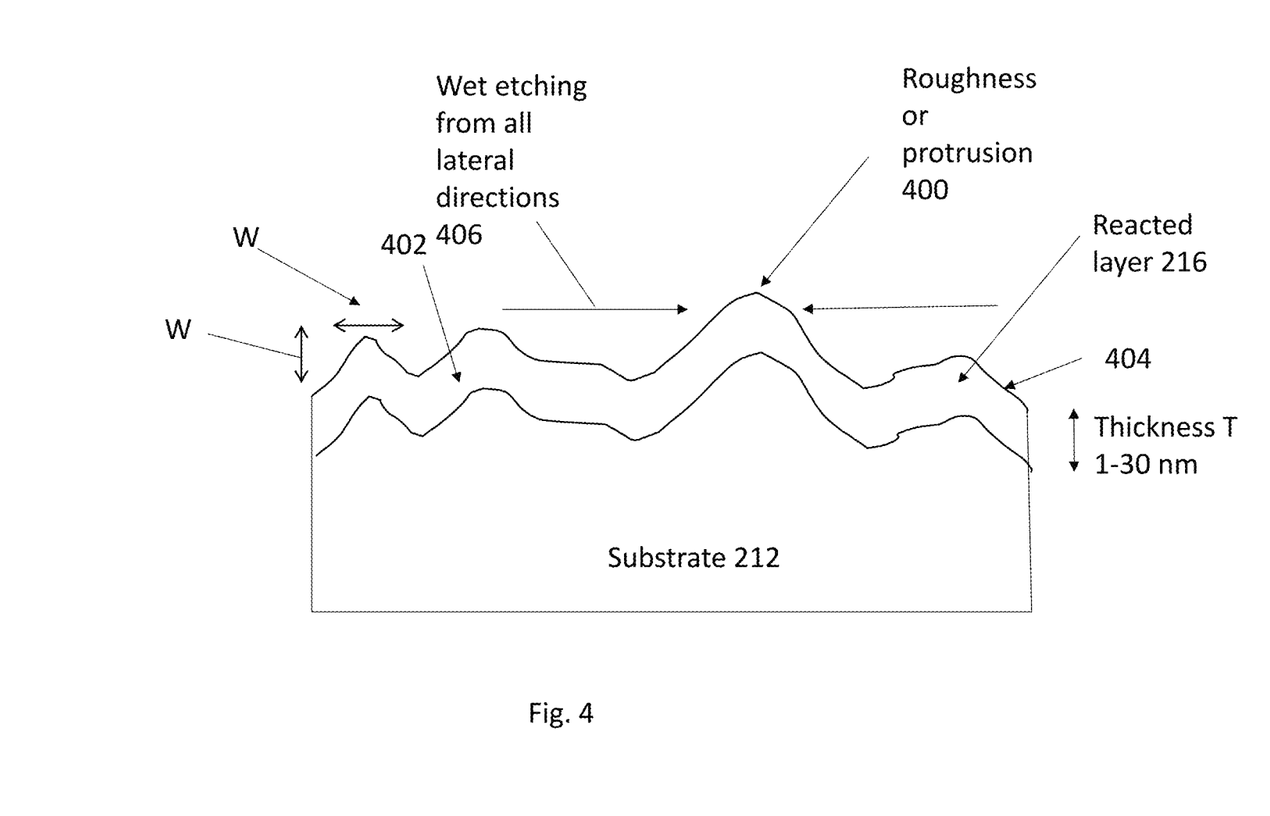
FIG. 4 is a schematic illustrating planarization of the substrate using the reactive layer.

1. A method for etching a surface, comprising:
    (a) obtaining a substrate 212 comprising a material;
    (b) reacting a surface 402 of a substrate with a reactant, comprising a gas or a plasma 210, to form a reactive layer 216 on the substrate, the reactive layer comprising a chemical compound including the reactant and the material; and
    (c) wet etching the reactive layer 216 with a (e.g., liquid) wet etchant 214 that selectively etches the reactive layer but not the substrate (e.g., selectively etches the reactive layer at much higher etch rate than the substrate so that the substrate is not significantly etched, or selectively etches the reactive layer over the substrate).
2. The method of example 1 wherein the reactive layer 216 or skin 216 formed in Block 104 comprises protrusions 400 having sidewalls 404 and the wet etching or dry etching etches the protrusions 400 laterally through the sidewalls (e.g., from all directions) so as to planarize the surface 402 and remove or shrink the protrusions.
3. The method of example 2, wherein the protrusions 400 have a height and width in a range of 1-100 nm.
4. The method of any of the examples 1-3 wherein the reacting in Block 104 comprises projecting the reactant onto the surface 402 with an energy below that required for physical sputtering of the surface using the reactant, so that the material is not ejected from the substrate.
5. The method of any of the examples 1-4 wherein the reacting in Block 104 is under conditions such that the reactive layer 216 is involatile or has low volatility or so that the reactive layer does not vaporize or enter into a gas phase (e.g., under the conditions used).
6. The method of any of the examples 1-5, further comprising performing the reacting for a duration and projecting the reactant 210 at the surface 402 with an energy or intensity so as to form the reactive layer having a desired thickness T (e.g., 30 nm or less, or in a range of 1-30 nm), e.g., without gouging the substrate 212.
7. The method of any of the examples 1-6 wherein the plurality of etching cycles form the substrate 212 having the surface 402 having an atomic scale surface roughness (e.g., a surface roughness less than 1 nm).
8. The method of any of the examples 1-7 wherein the reacting in Block 104 is at a pressure of 10 Torr or less and the wet etching in Block 108 is at or near atmospheric pressure (e.g., at the pressure of 500-1000 Torr). Block 102 or 104 may also be at the pressure of 500-1000 Torr. Block 108 may also be at a pressure of 10 Torr or less.

9. The method of any of the examples 1-8 wherein the wet etching in Block 108 dissolves or etches an entirety or a portion of reactive layer 216.
10. The method of any of the examples 1-10 further comprising performing a thermal or plasma or ultraviolet (UV) treatment of the wet etched substrate (after step 108) and/or the reactive layer 216.
11. The method of any of the examples 1-10 wherein the material in the substrate 212 comprises a metal whose oxide, chloride, fluoride, bromide, etc. is readily removed in acids or bases, but the pure metal is untouched by the etching. For example, the reacting in Block 104 may comprise an oxidation step, which is often self-limiting due to Deal-Grove type reaction and diffusion of oxidative species. Then, in Block 108, the oxidized surface is etched away by a liquid or fluid based step where the acid, base, or other wet chemistry attacks the metal oxide, but stops on the pristine metal. Since the oxide is conformal and self-limiting, protrusions or other surface roughness is attacked in all directions at the same rate, leading to the shrinking of the protrusions and reduction in the overall roughness of the material.
12. In another embodiment, e.g., of any of the examples 1-11, the reactive layer comprises an oxide that is more planar than the starting material, and therefore be able to be reduced and smoothed in a reducing environment such as ammoniagas, hydrazine, hydrogen plasma, etc.
13. In another embodiment, e.g., of any of the examples 1-12 where the material in the substrate comprises a metal whose smoothing process involves an oxidation step in Block 104, followed by wet etching in an acidic solution in Block 108, the method further includes high throughput processing of samples and devices, e.g., using oxidation by high temperature oxidation, UV ozone exposure, or exposure to oxygen radicals.
14. In an embodiment, e.g., of any of the examples 1-13, where other materials are present (such as low-K dielectrics} that are sensitive to oxidation with $O_2$ in the reactive layer formation step in Block 102, it is also possible to use CO or $CO_2$ based or other carbon containing species that will "heal" the dielectric at the same time the metal in the substrate is oxidized in Block 104.
15. In one or more embodiments, e.g., of one or more of the examples 1-14, the oxidation step can also take place in the wet etching process step of Block 108, wherein a self-limiting oxide "skin" or reaction layer 216 is formed prior to subsequent wet etching.
16. The method of any of the examples 1-15 wherein the reacting step in Block 104 comprises atomic layer deposition and the removal step in Block 108 comprises atomic layer etching or a self limiting etch.
17. The method of any of the examples 1-16 wherein formation of the reactive layer forms a polycrystalline metal including grain boundaries and the wet etch in Block 108 is isotropic so as to remove the grain boundaries in both lateral and vertical directions.
18. The method of any of the examples 1-17, wherein the reactive layer is formed using atomic layer deposition and the etching step in block 108 is performed using atomic layer etching.
19. In one or more of the examples 1-18, e.g., wherein the reactive layer is formed by oxidation, the wet etchant selected for the wet etching in Block 108 is selected depending on the oxidation state of the reactive layer (e.g., for the case of etching copper, Cu I chloride etches only in acid, Cu II chloride etches in water).
20. The method of any of the examples 1-19, where an additional activation step is performed so as to make the reactive layer more amenable for removal in the subsequent wet etching step.
21. The method of any of the examples 1-20, wherein the substrate temperature is at below a point where the reacted layer's volatility is low.
22. The method of example 21 where the reacted layer is involatile.
23. The method of any of the examples 1-22, wherein the reactive layer comprises valleys 410 having sidewalls and the wet etching etches the valleys laterally through the sidewalls so as to planarize the surface and remove or connect the valleys.
24. The method of example 23, wherein the valleys have a height and width in a range of 1-100 nm.
25. The method of any of the examples 1-24, wherein the reactant comprises an oxidizer that chlorinates the surface 402 to form the reactive layer 216 comprising a chloride.
26. The method of any of the examples 1-25, wherein the reactant comprises an oxidizer that oxidizes the surface 402 to form the reactive layer 216 comprising a fluoride, bromide, nitride, or sulphide.
27. The method of claim of any of the examples, wherein the plurality of etching cycles form the substrate 212 having a root means squared (RMS) surface roughness of less than 1 nm.
28. The method or apparatus of any of the examples 1-28, wherein the reactive layer comprises a reacted layer. In one or more examples, the reactive layer can be considered reacted if activation is not needed.

Example Apparatus

Figure 2A:
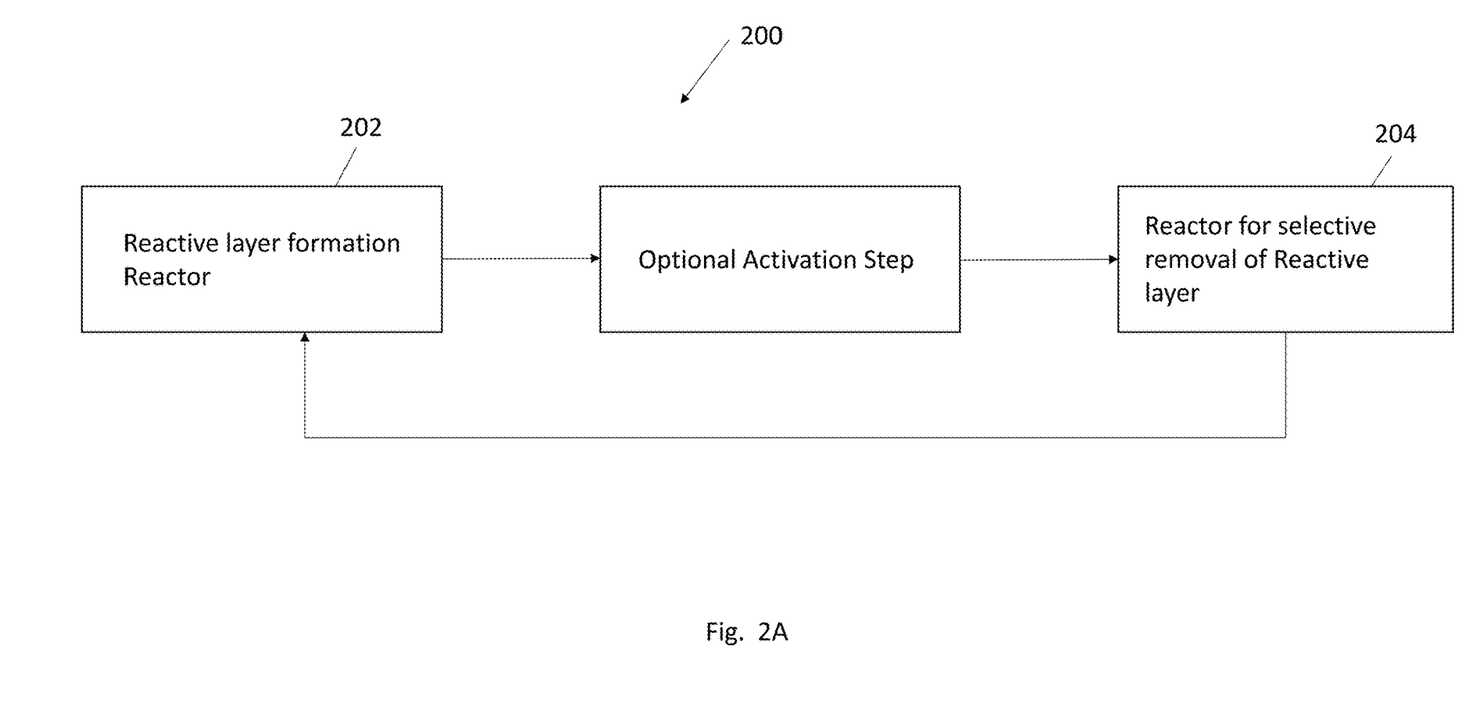
FIG. 2A illustrates an example apparatus performing the method illustrated in FIG. 1 and the associated text.

FIG. 2A illustrates an apparatus 200 or equipment for etching a substrate, comprising one or more reactor tools 202 (e.g., a dry etching station, dry etching tool, or dry process chamber) configured for reacting a reactant with a surface of a substrate, wherein the reactant comprises a gas or a plasma reacting with the substrate to form a reactive layer on the substrate so that the reactive layer comprises a chemical compound including the reactant and the material. In various examples, the reactor tool comprises a source of reactant comprising a reservoir containing the reactant, a nozzle or outlet connected to the reservoir for outputting the reactant towards the substrate, and an accelerating device (e.g., electrodes and/or coils or wires electrically connected to a voltage supply) for accelerating the reactant (e.g., comprising charged particles such as ions) towards the substrate. In one or more examples, the reactor tool comprises an inductively coupled plasma tool or torch. The apparatus 200 further includes one or more etching tools 204 (e.g., wet etching stations or wet process chambers) selectively etching the reactive layer using an (e.g., liquid) wet etchant. In various examples, the etching tools comprise a bath, tank, or spray system comprising a reservoir containing the wet etchant and a spray nozzle for spraying the reactive layer with the wet etchant.

Figure 2B:
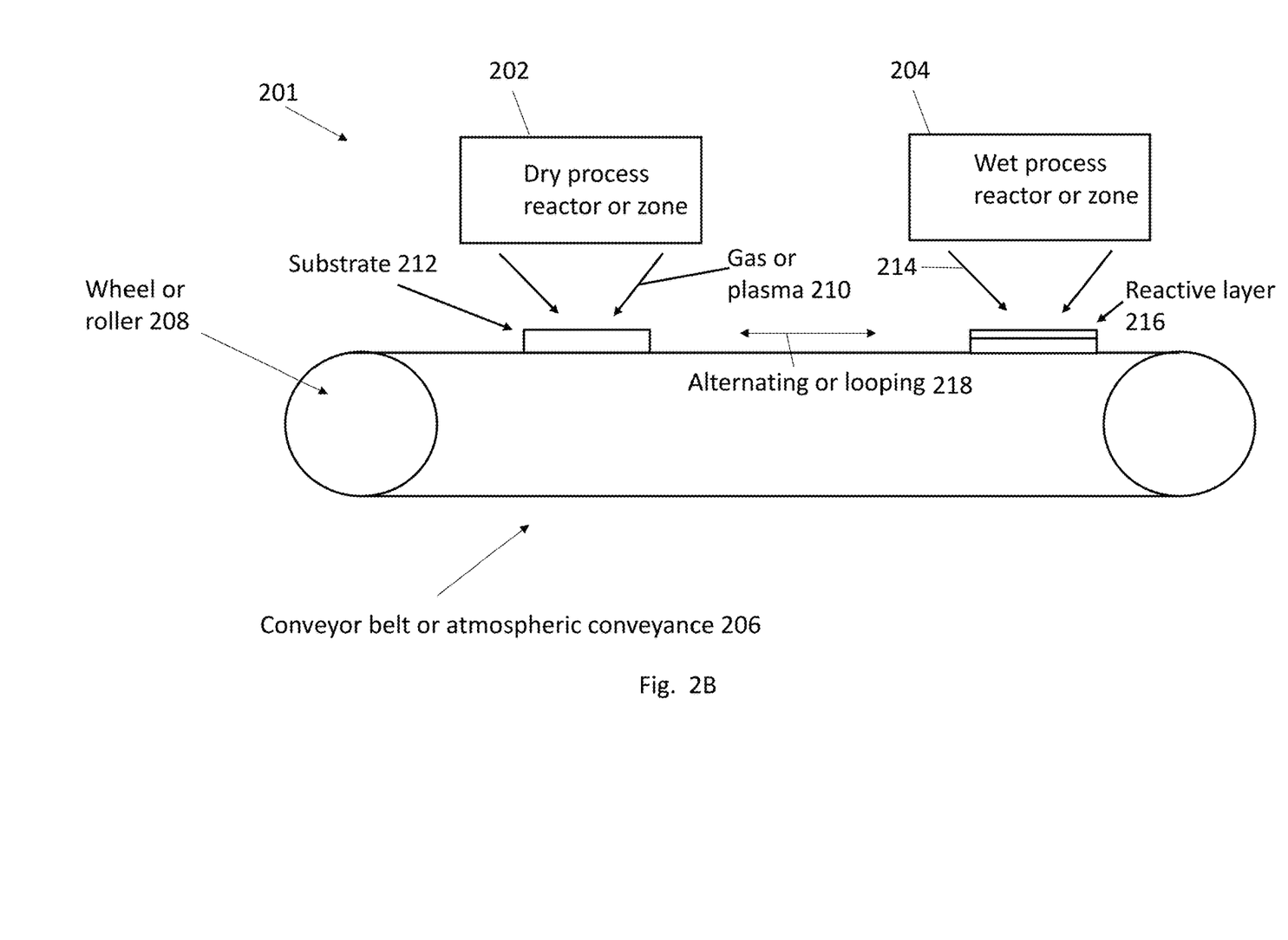
FIG. 2B illustrates another example apparatus including a conveyor belt and performing the etching or smoothing as described in FIG. 1 and associated text.

FIG. 2B illustrates an example apparatus 201 further including a conveyor 206 (e.g., conveyor belt) or atmospheric conveyance conveying the substrate between the reactor tools and the etching tools. In one or more examples, the etching tools and the reactor tools operate at or near atmospheric pressure. Also shown are the roller 208 for moving the conveyor belt 206, the gas or plasma 210 outputted from or in the dry process reactor or zone 202 and onto the substrate 212 so as to form the reactive layer 216, and the wet etchant 214 outputted from or in the wet process reactor or zone 204 and onto the reactive layer 216. The conveyance can alternate or loop 218 the substrate between the dry process reactor or zone 202 and the wet process reactor or zone 204.

Figure 2C:
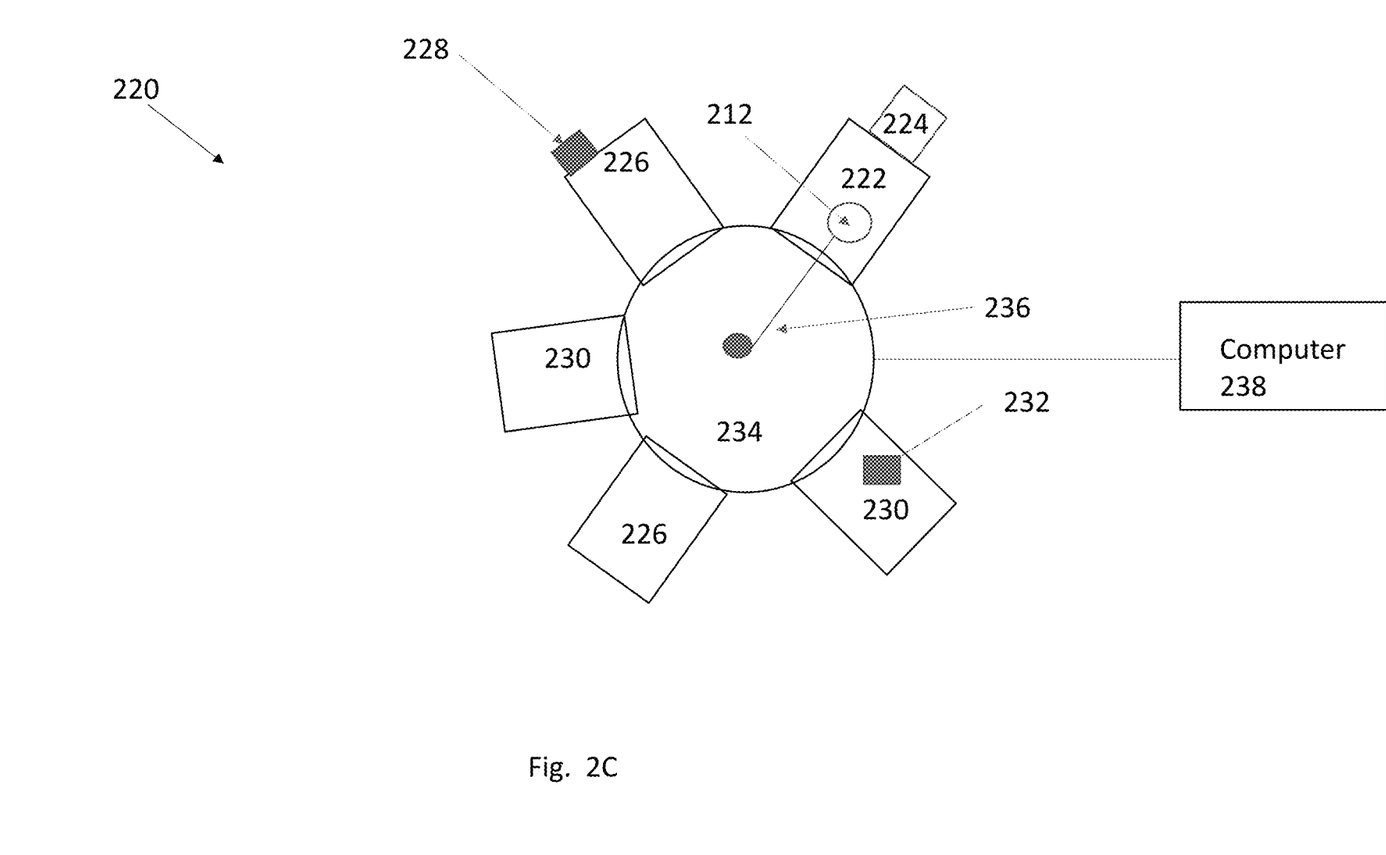
FIG. 2C illustrates yet another example apparatus comprising a cluster tool for performing the method of FIG. 1 and associated text.

FIG. 2C illustrates an example apparatus 220 (e.g., cluster tool) for performing the etching method. The apparatus comprises a load lock chamber 222 for loading a substrate 212 comprising a material into the apparatus; a loading port 224 for loading the substrate into the load lock chamber; one or more dry process chambers 226 coupled to a source 228 of a reactant; and one or more wet process chambers 230 coupled to a source 232 of (e.g., liquid) wet etchant; a transfer chamber 234; and one or more arms 236.

The reactant in the dry process chamber comprises a gas or a plasma 210 reacting with a surface of a substrate 212 in the one of the dry process chambers to form a reactive layer on the substrate, the reactive layer comprising a chemical compound including the reactant and the material. The dry process chamber can comprise one or more electrodes and one or more voltage sources for applying a bias voltage accelerating the ions in the plasma to the substrate. In one or more examples, the source of the reactant comprises an inductively coupled plasma. In one or more examples, the source of the reactant comprises a near atmospheric pressure plasma. In addition, the dry process chamber can be an environmentally controlled oven that introduces reactive gases that can react with the surface to make the reactive layer. That reaction process can be dissociative chemisorption (such as $Cl_2$ and Cu forming CuCl and/or $CuCl_2$ due to thermal energy only with no plasma needed). The (e.g., liquid) wet etchant in wet process chamber selectively etches the reactive layer (e.g., over the substrate, at a much higher etch rate than the material in the substrate, or so that the substrate or the material in the substrate is not etched) in one of the wet process chambers.

The transfer chamber transfers the substrate between the load lock, the dry process chambers, and the wet process chambers. The one or more arms are positioned to transfer the substrate between the load lock, the dry process chambers, and the wet process chambers.

FIG. 2C further illustrates a computer 238 (*a*) instructing the conveying system (e.g., arm or conveyor belt) to move the substrate to one of the reactor tools and instructing the reactor tool to control output of the reactant onto the substrate so as to initiate and control the reacting; and (b) instructing the conveyor system to move the substrate to one of the etching tools and instructing the source of the wet etchant to controllably contact the wet etchant on the reactive layer so as to controllably wet etch the reactive layer after formation of the reactive layer.

In one example, the substrate can be carried through or past the reactor comprising an oxidative region or reducing region (wherein a reactive layer is formed on the substrate through oxidation or reduction using, for example, oxygen, halogens, or gases) on a conveyor belt or into the reactor comprising vacuum chamber with a specified isolated region. After oxidation or reduction, the substrate can be carried into or through the wet process etching tool comprising a spray coating system that can apply a dilute aqueous acid, base, or solvent to strip the oxide or reactive layer. In another example, the wet etching tool comprises a bath (e.g., comprising aqueous acid, base, or solvent) wherein the substrate is dipped to remove the reactive layer.

In another embodiment, the reactor tool comprises an atmospheric plasma or ultraviolet (UV) ozone system configured to raster over or expose the substrate and the etching tool comprises a spray coating system to first apply an acid, base, or solvent and then spray neutral pH solutions to remove the acidic or basic liquid(s).

In various examples, the apparatus includes a plurality of (e.g., two) reactors and a plurality of (e.g., two) wet etching tools. One of the reactors may comprise a reactor for forming a reactive layer useful for coarse etching in the subsequent wet etching (Block 108), and another of the reactors may comprise a reactor for forming the reactive layer configured for fine etching in the subsequent wet etching (block 108). In other examples, the substrate is transferred back and forth between a reactor tool an etching tool to perform the multiple cycles of etching.

In one or more examples, the apparatus may further comprise an oven or thermal chamber for drying or heating the substrate during one or more of the steps 104-108.

In one or more examples, the apparatus comprises a pre-cleaning module for pre-cleaning a surface of the substrate (e.g., using argon ion bombardment, oxygen cleaning, or hydrogen reduction) prior to forming the reactive layer.

In one or more examples, the apparatus includes an activation module for activating the reactive layer (e.g., using argon ion bombardment) prior to the wet etching step. In or more examples, the reactor comprises or is coupled to the pre-cleaning and/or activation modules.

Illustrative, non-exclusive examples of an apparatus according to the present disclosure are described in the following enumerated examples (referring also to FIGS. 1-5).

29. An apparatus 200 for etching a substrate 212, comprising:
one or more reactor tools 202 reacting a reactant with a surface 402 of a substrate 212 so as to form a reactive layer on the substrate, wherein the reactant comprises a gas or plasma 210, the substrate comprises a material, and the reactive layer comprises a chemical compound including the reactant and the material; and
one or more etching tools 204 selectively etching the reactive layer using a liquid wet etchant.

30. The apparatus of example 29, further comprising a conveyor 206 conveying the substrate 212 between the reactor tools 202 and the etching tools 204, wherein the etching tools and the reactor tools operate at or near atmospheric pressure.

31. The apparatus of example 29, further comprising:
a load lock chamber 222 for loading the substrate 212 comprising a material into the apparatus;
a transfer chamber 234 for transferring the substrate 212 between the load lock 222, the reactor tools 202, 226, and the etching tools 230, 204; and
one or more arms 236 positioned to transfer the substrate between the load lock, the reactor tools, and the etching tools.

Figure 5:
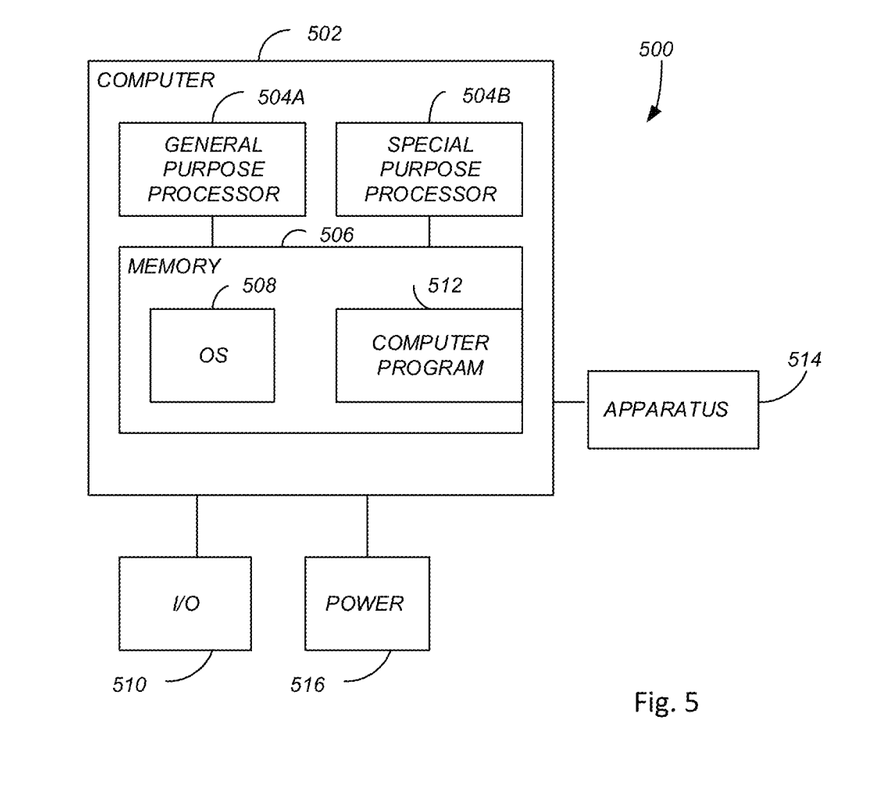
FIG. 5 illustrates an example computer or controller used to control the etching apparatus.

32. The apparatus of any of the examples 29-31, further comprising a computer 238, 600:
(a) instructing the one or more arms to move the substrate to one of the reactor tools and controlling the reactor so as to form the reactive layer; and'
(b) instructing the one or more arms to move the substrate to one of the etching tools and controlling the one or the etching tools so as to wet etch the reactive layer.

33. The apparatus of example 32, wherein the computer 600:
instructs a repeat of steps (a) and (b) so as to perform a plurality of etching cycles each comprising the step (a) and the step (b), wherein:
the cycles include a first cycle and a second cycle subsequent to the first cycle, the second cycle forms the reactive layer that is thinner as compared to the reactive layer formed in the first cycle, so that the wet etching in the second cycle etches the reactive layer with a finer resolution as compared to the wet etching in the first cycle.

34. An apparatus configured to perform the method of any of the method examples 1-28.

35. A substrate 212 having a planarized or smooth surface 402 formed using the method or apparatus of any of the examples 1-30.

Example Results

Figure 3A:
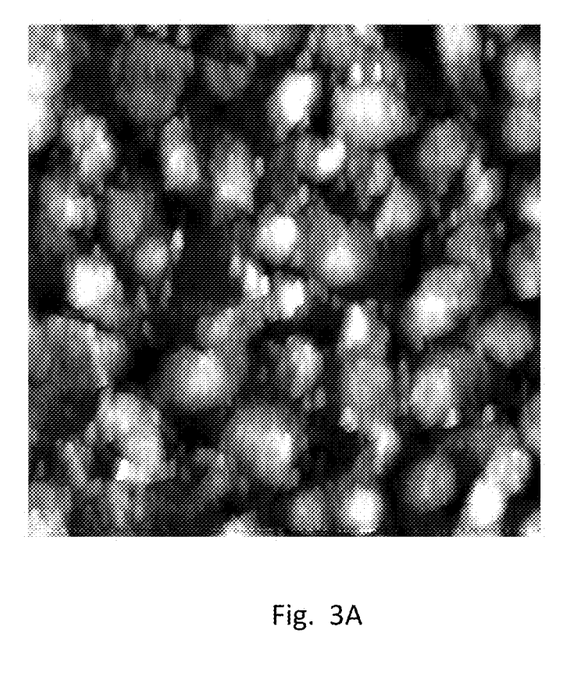
Figure 3B:
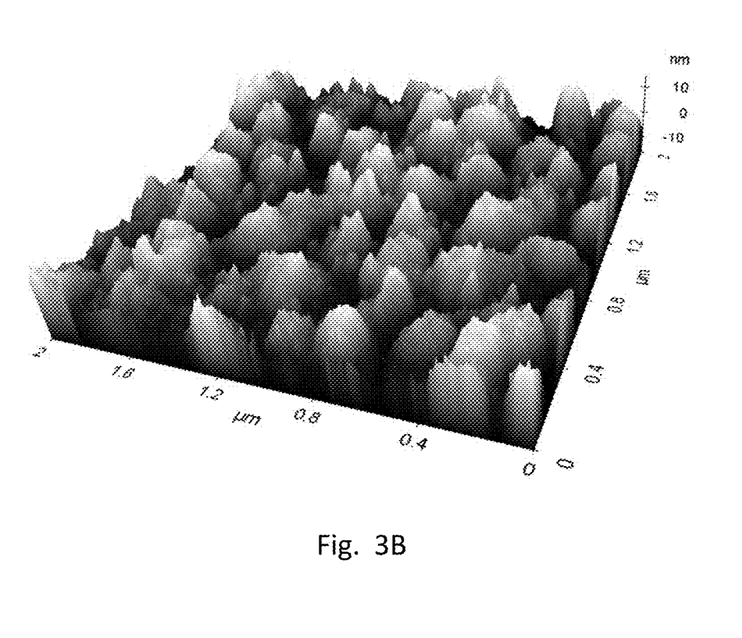
Figure 3C:
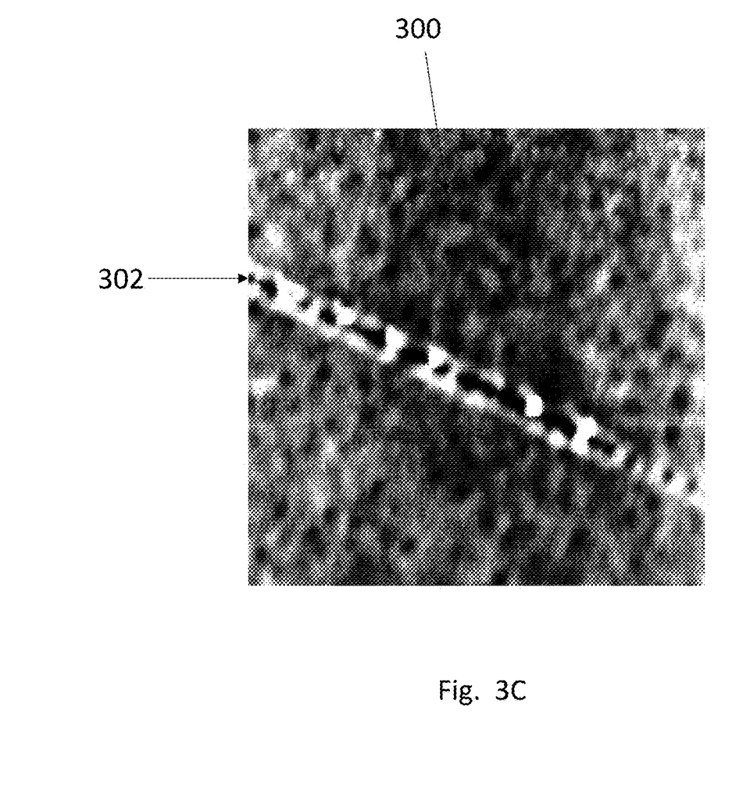
Figure 3D:
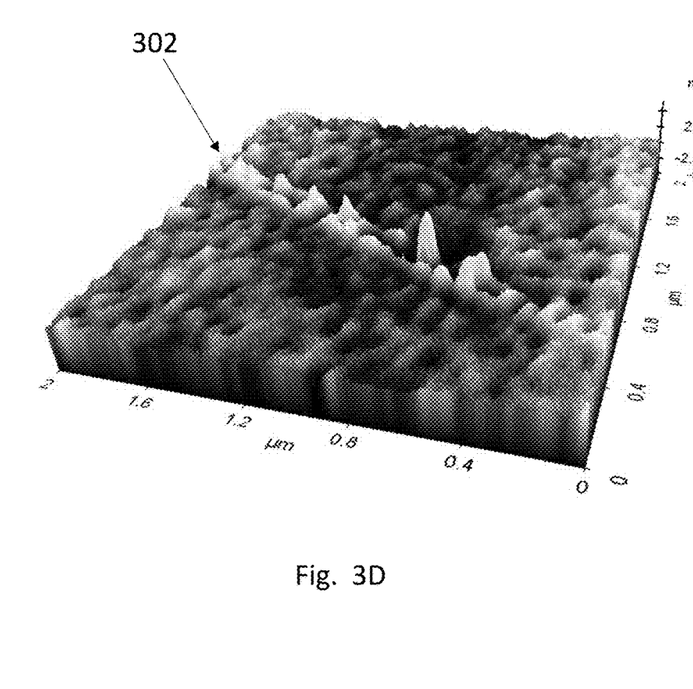
Figure 3E:
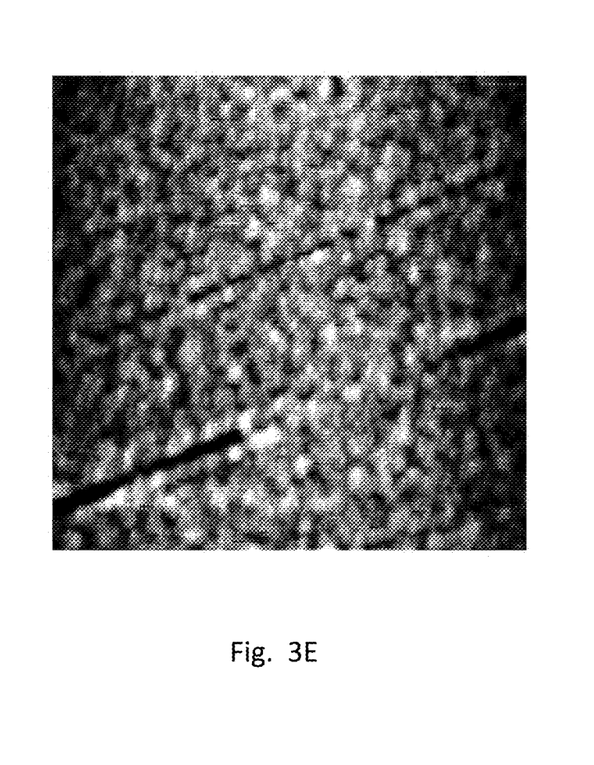
Figure 3F:
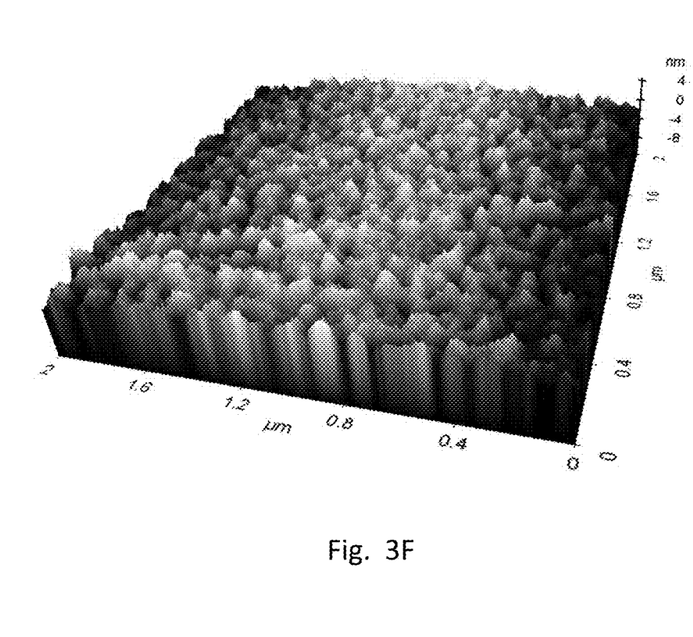

FIG. 3A and FIG. 3B illustrate an atomic force microscope (AFM) image of the surface of a copper surface prior to etching. The root mean square roughness is at least 5.0 nanometers (nm) over the 2 micron (μm) by 2 micron area. FIG. 3C-3F illustrate the surface 300 of the copper substrate after the atomic layer etching using the method of FIG. 1. The post processing scratch 302 in FIGS. 3C and 3D was formed after the etching and is not related to the etching process described herein. In some examples, the planarization achieves the copper surface 300 having a root mean square roughness of 0.5 nm or less over the 2 micron by 2 micron square area.

The effectiveness of the method has been demonstrated on blanket copper surfaces as well as amorphous silicon, Yittrium-Barium-Copper-Oxide, Silicon Dioxide, amorphous silicon, InAs, and InP.

34. FIG. 4 illustrates how the reactive layer 216 on the substrate 212 comprises protrusions 400 conformal with the roughness of the surface 402 of the substrate 212 and the protrusions have sidewalls 404. The wet etching of Block 108 etches the protrusions laterally 406 through or via the sidewalls 404 so as to planarize the surface 402 and remove or shrink the protrusions 400. In one or more examples, the height H and width W of each of the protrusions 400 in the reactive layer are in a range of 1-100 nm (1≤H, W≤100 nm) and/or the reactive layer 216 has a thickness T in a range of 1-30 nm (1≤T≤30 nm). FIG. 4 further illustrates the reactive layer 216 comprises valleys 410 having sidewalls and the wet etching etches the valleys laterally through the sidewalls so as to planarize the surface 402 and remove or connect the valleys.

Advantages and Improvements

As the critical dimension of the active layers reaches the 10's of nanometer scale, the smoothness of the interfaces and the layers themselves becomes increasingly important. This is true for mirrors and filters as well as semiconductor devices. Smooth interfaces between different materials brought together are also desirable for various applications.

Embodiments of the present invention perform "nano-planarization" using both an ALE process (removing material from the substrate) and an ALD process (adding material to the substrate). Using appropriate etching conditions, exemplary nano-planarization methods described herein can controllably remove large protrusions in a quasi-conformal fashion, because the sidewalls of the protrusions have a portion of their projected area that is exposed to the wet etchant or the gas or plasma particles bombarding the surface (in a dry etching process). The asperities or roughness on the flat surface are smoothed out because the lateral etch rate in the ALE process (or self-limiting etch) is comparable to the etch rate of flat surface, leading to the asperities shrinking with each successive etching cycle.

In some examples, the nano-planarization method is capable of completely eliminating submicron scale roughness and smoothing out topology on the nanometer scale, to a level not achievable using conventional chemical-mechanical polishing. While electropolishing can polish some metals to achieve smooth finishes, electropolishing is difficult to control in comparison to a self-limiting etch process where exactly the right amount of material can be etched.

Example Computer Hardware

FIG. 5 illustrates an exemplary system 500 that could be used to implement processing elements needed to control the etching apparatus 200, 201, 220 described herein.

The computer 502 comprises a processor 504 (general purpose processor 504A and special purpose processor 504B) and a memory, such as random access memory (RAM) 506. Generally, the computer 502 operates under control of an operating system 508 stored in the memory 506, and interfaces with the user/other computers to accept inputs and commands (e.g., analog or digital signals) and to present results through an input/output (I/O) module 510. The computer program application 512 accesses and manipulates data stored in the memory 506 of the computer 502. The operating system 508 and the computer program 512 are comprised of instructions which, when read and executed by the computer 502, cause the computer 502 to perform the operations herein described. In one embodiment, instructions implementing the operating system 508 and the computer program 510 are tangibly embodied in the memory 506, thereby making a computer program product or article of manufacture. As such, the terms "article of manufacture," "program storage device" and "computer program product" as used herein are intended to encompass a computer program accessible from any computer readable device or media.

In one embodiment, computer 502 comprises one or more field programmable gate arrays (FPGAs) or application specific integrated circuits (ASIC).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus:
a reactor tool comprising a source of a reactant for reacting with a surface of a substrate so as to form a reactive layer on the substrate, wherein the reactant comprises is generated by a plasma, the substrate comprises a material comprising a semiconductor, a metal, or a dielectric, and the reactive layer comprises a chemical compound including the reactant and the material; and
an etching tool comprising a source of a liquid wet etchant for removing the chemical compound; and a computer tool comprising a non-transitory computer readable medium storing a plurality of instructions, the plurality of instructions comprising:
outputting the reactant in the reactor tool,
transferring the substrate between the reactor tool and the etching tool, and
outputting the liquid wet etchant in the etching tool to remove the chemical compound at a higher rate than the material so as to smoothen the surface of the substrate and form the surface having a root mean square surface roughness of less than 1 nm.

2. The apparatus of claim 1, wherein:
the reactive layer comprises at least one of:
protrusions having sidewalls and the removing comprising wet etching the protrusions laterally through the sidewalls so as to planarize the surface and remove or shrink the protrusions, the protrusions having a height or width in a range of 1-100 nm; or
valleys having sidewalls and the removing comprising wet etching the valleys laterally through the sidewalls so as to planarize the surface and remove or connect the valleys.

3. The apparatus of claim 1, wherein the reactant comprises at least one of a halogen that halogenates the surface, a sulphide so as to form the reactive layer comprising a sulphide, hydrogen or a hydride so as to form the reactive layer comprising a hydride, or a nitride or nitrogen or nitrogen containing species so as to form the reactive layer comprising a nitride.

4. The apparatus of claim 1, wherein the reactant forms the reactive layer comprising a salt.

5. The apparatus of claim 1, further comprising a computer controlling output of the reactant and the wet etchant suitable for smoothing the material comprising a semiconductor comprising a III-V material or a metal comprising copper.

6. The apparatus of claim 1, further comprising a computer controlling output of the reactant and the wet etchant so as to form the reactive layer forming a polycrystalline metal including grain boundaries so that the wet etching is isotropic so as to remove grain boundaries in both lateral and vertical directions.

7. The apparatus of claim 1, further comprising the: computer programmable to:
(a) instruct the output of the reactant so as to form the reactive layer; and
(b) instruct the output of the liquid wet etchant, wherein:
the step (a) forming the reactive layer further comprises at least one of:
a pre-cleaning step prior to forming the reactive layer, or
an activating step so as to make the reactive layer more amenable for the removing, and the computer is programmable to instruct repeating the step (a) prior to performing step (b).

8. The apparatus of claim 7, wherein the computer is programmable to instruct that the step (b) is performed only once.

9. The apparatus of claim 1, further comprising a tool configured to contact the liquid wet etchant with the reactive layer and so that the liquid wet etchant removes the reactive layer using a self-limiting process.

10. The apparatus of claim 9, wherein the tool comprises a bath or tank comprising the liquid wet etchant or a spray system spraying the liquid wet etchant.

11. The apparatus of claim 9, further comprising a tool configured to control contact of the liquid wet etchant on the reactive layer so as to controllably wet etch the reactive layer.

12. An apparatus, comprising:
a source of a reactant reacting with a surface of a substrate so as to form a reactive layer on the substrate, wherein the reactant is in gaseous form or is generated by a plasma, the substrate comprises a material, and the reactive layer comprises a chemical compound including the reactant and the material;
a source of a treatment that removes the chemical compound at a higher rate than the material; and
a computer programmable to:
(a) instruct output of the reactant so as to form the reactive layer;
(b) instruct performance of the treatment, and
(c) instruct a repeat of steps (a) and (b) so as to perform a first cycle and a second cycle each comprising the step (a) and the step (b), wherein:
the second cycle forms the reactive layer having a thickness that is thinner as compared to the reactive layer formed in the first cycle, so that the treatment in the second cycle removes the reactive layer with a finer resolution as compared to in the first cycle.

13. The apparatus of claim 12, further comprising a conveyor conveying the substrate between a first region wherein the reactant reacts with the surface of the substrate, and a second region wherein the treatment removes the reactive layer.

14. The apparatus of claim 12, further comprising: one or more reactor tools;
one or more etching tools;
a load lock chamber for loading the substrate comprising the material into the apparatus;
a transfer chamber for transferring the substrate between the load lock, the reactor tools, and the etching tools;
one or more arms positioned to transfer the substrate between the load lock, the reactor tools, and the etching tools; and
a computer programmable to:
(a) instruct the one or more arms to move the substrate to one of the reactor tools and controlling the one of the reactor tools so as to form the reactive layer; and'
(b) instruct the one or more arms to move the substrate to one of the etching tools and controlling the one of the etching tools so as to perform the treatment comprising a wet etch of the reactive layer.

15. The apparatus of claim 12, wherein the reactant comprises at least one of a halogen that halogenates the surface, a sulphide so as to form the reactive layer comprising a sulphide, hydrogen or a hydride so as to form the reactive layer comprising a hydride, a nitride or nitrogen or nitrogen containing species so as to form the reactive layer comprising a nitride, or oxygen or an oxide so as to form the reactive layer comprising an oxide.

16. The apparatus of claim 12, further comprising one or more chambers comprising first regions, wherein the chambers each comprise a vacuum or a pressure below atmospheric pressure during the reacting.

17. The apparatus of claim 12, further comprising:
one or more reactor tools each comprising a first region, an outlet connected to a source of the reactant, the outlet for outputting the reactant towards the substrate in the first region, and electrodes and/or coils or wires electrically connected to a voltage supply for accelerating the reactant comprising charged particles towards the substrate; and one or more etching tools each comprising a bath, tank, or spray system, wherein:

the treatment comprises a liquid wet etchant, the spray system comprises a spray nozzle for spraying the reactive layer with the wet etchant, and the spray system comprises or is coupled to a reservoir containing the wet etchant.

18. The apparatus of claim 12, wherein the treatment smoothens the surface of the substrate and forms the surface having a root means squared (RMS) surface roughness of less than 1 nm for an optical, mechanical, or assembly application.

19. The apparatus of claim 12, further performing a thermal treatment, a plasma treatment, or an ultraviolet (UV) treatment of the reactive layer.

20. The apparatus of claim 19, wherein the removing comprises performing the thermal treatment, the plasma treatment, or the UV treatment.

21. An apparatus, comprising:
a reactor tool for reacting a reactant with a surface of a substrate so as to form a reactive layer on the substrate, wherein the reactant comprises a plasma, and the reactive layer comprises a chemical compound including the reactant and the material;
an etching tool for applying a treatment for removing the chemical compound at a higher rate than the material;
a transfer chamber for transferring the substrate between the reactor tool and the etching tool;
a computer programmable to instruct the apparatus to:
(a) instruct the reactor tool to form the reactive layer and at least perform:
a cleaning of the surface of the substrate prior to forming the reactive layer, or activating of the reactive layer so as to make the reactive layer more amenable for the removing;
(b) repeat the step (a) in a presence of the reactive layer previously formed; and
(c) instruct the etching tool to perform the treatment of the reactive layer to remove the reactive layer, such that the substrate is smoother after the reactive layer is removed.

22. The apparatus of claim 21, wherein the step (a) comprises the activating.

23. The apparatus of claim 21, wherein the activating comprises ion bombardment.

24. The apparatus of claim 21, wherein the activating changes at least one of a stoichiometry or oxidation state of the reactive layer.

25. The apparatus of claim 21, wherein the step (a) comprises the pre-cleaning.

26. The apparatus of claim 21, wherein the step (a) comprises the pre-cleaning and the activating.

27. The apparatus of claim 21, wherein the computer is programmable to instruct the apparatus to perform the treatment of the reactive layer only once.

28. An apparatus comprising:
a reactor tool comprising a source of a reactant, wherein the reactor tool is configured to ignite a plasma comprising the reactant;
an etching tool comprising a source of a liquid wet etchant; and
a substrate with a reactive layer disposed in the etching tool, wherein:
the substrate comprises a material comprising a semiconductor, a metal, or a dielectric,
the reactive layer was formed by reacting a surface of the substrate with the reactant and the plasma in the reactor tool,
the reactive layer comprises a chemical compound including the reactant and the material, and
the liquid wet etchant is configured to remove the chemical compound at a higher rate than the material in order to smoothen the surface of the substrate and to form the surface having a root mean square surface roughness of less than 1 nm.

\* \* \* \* \*